(12) United States Patent
Tsuyuno et al.

(10) Patent No.: US 12,506,046 B2
(45) Date of Patent: Dec. 23, 2025

(54) ELECTRIC CIRCUIT BODY, POWER CONVERTER, AND METHOD FOR MANUFACTURING ELECTRIC CIRCUIT BODY

(71) Applicant: HITACHI ASTEMO, LTD., Hitachinaka (JP)

(72) Inventors: Nobutake Tsuyuno, Tokyo (JP); Yujiro Kaneko, Hitachinaka (JP); Akira Matsushita, Hitachinaka (JP); Masahito Mochizuki, Tokyo (JP); Eiichi Ide, Tokyo (JP); Junpei Kusukawa, Tokyo (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 903 days.

(21) Appl. No.: 17/760,722

(22) PCT Filed: Aug. 14, 2020

(86) PCT No.: PCT/JP2020/030852
§ 371 (c)(1),
(2) Date: Mar. 15, 2022

(87) PCT Pub. No.: WO2021/054008
PCT Pub. Date: Mar. 25, 2021

(65) Prior Publication Data
US 2022/0336324 A1    Oct. 20, 2022

(30) Foreign Application Priority Data

Sep. 18, 2019   (JP) ................................. 2019-169820

(51) Int. Cl.
*H01L 21/48* (2006.01)
*H01L 23/473* (2006.01)
(Continued)

(52) U.S. Cl.
CPC ........ *H01L 23/473* (2013.01); *H01L 21/4882* (2013.01); *H01L 25/072* (2013.01);
(Continued)

(58) Field of Classification Search
CPC . H01L 21/4882; H01L 21/565; H01L 23/051; H01L 23/3107; H01L 23/3735;
(Continued)

(56) References Cited

U.S. PATENT DOCUMENTS

2001/0033477 A1   10/2001   Inoue et al.
2004/0089928 A1   5/2004    Nakajima et al.

FOREIGN PATENT DOCUMENTS

CN     1499619 A        5/2004
JP     2001-320005 A    11/2001
(Continued)

OTHER PUBLICATIONS

German Office Action issued in corresponding DE Application No. 112020003598.0 with English translation (11 pages).
(Continued)

*Primary Examiner* — Ajay Ojha
*Assistant Examiner* — Sandra Milena Rodriguez Villanu
(74) *Attorney, Agent, or Firm* — Foley & Lardner LLP

(57) ABSTRACT

A sheet-shaped member 440 including a resin insulating layer 441 and a metal foil 442 is used. The sheet-shaped member 440 is deformed following warpage or step difference in a second conductor plate 431 and a fourth conductor plate 433, and therefore, the thickness of the resin insulating layer 441 can be set to a constant thickness of, for example, 120 μm capable of securing insulation properties. By plastically deforming a metal-based heat conduction member 450 having a thickness of, for example, 120 μm interposed between the sheet-shaped member 440 and a cooling member 340, the thickness of the metal-based heat conduction
(Continued)

member 450 is changed to absorb the warpage or step difference generated in the second conductor plate 431 and the fourth conductor plate 433. This results in remarkable improvement in heat dissipation as compared with a case where the conductor plates are brought into contact with the cooling member 340 via an insulating layer alone.

9 Claims, 13 Drawing Sheets

(51) Int. Cl.
*H01L 25/07* (2006.01)
*H02M 7/00* (2006.01)
*H02M 7/5387* (2007.01)
*H05K 7/20* (2006.01)

(52) U.S. Cl.
CPC ....... *H02M 7/003* (2013.01); *H02M 7/53871* (2013.01); *H05K 7/209* (2013.01)

(58) Field of Classification Search
CPC ......... H01L 23/4334; H01L 2224/0603; H01L 2224/40137; H01L 2924/181; H01L 23/367; H01L 23/3736; H01L 25/07; H01L 21/4871; H01L 2023/4037; H01L 23/34; H01L 2023/4043; H05K 7/209; B23K 3/085; F28F 2275/025
See application file for complete search history.

(56) References Cited

FOREIGN PATENT DOCUMENTS

| | | | | |
|---|---|---|---|---|
| JP | 2011-216564 A1 | 10/2011 | | |
| JP | 2011216564 A | * 10/2011 | ............. | H01L 24/33 |
| JP | 2013258334 A | * 12/2013 | ............. | H01L 24/36 |
| JP | 2016-136604 A | 7/2016 | | |
| JP | 2017-059606 A | 3/2017 | | |
| JP | 2018-026370 A | 2/2018 | | |
| JP | 2019037047 A | * 3/2019 | ......... | H01L 21/4871 |

OTHER PUBLICATIONS

International Search Report with English translation and Written Opinion issued in corresponding application No. PCT/JP2020/030852 dated Dec. 15, 2020.

Chinese Office Action issued in corresponding CN Application No. 202080056375.3, dated Mar. 21, 2025 with English translation (12 pages).

* cited by examiner

ELECTRIC CIRCUIT BODY, POWER CONVERTER, AND METHOD FOR MANUFACTURING ELECTRIC CIRCUIT BODY

TECHNICAL FIELD

The present invention relates to an electric circuit body, a power converter, and a method for manufacturing an electric circuit body.

BACKGROUND ART

A power converter using switching of a power semiconductor element has high conversion efficiency, and thus is widely available for consumer use, in-vehicle use, railway use, use of transformation equipment, and the like. Since this power semiconductor element generates heat by energization, high heat dissipation is required. For example, for in-vehicle use, a high efficiency device using a water cooling system is adopted for reduction in size and weight. PTL 1 discloses a power module in which heat generated in an IGBT or a diode is transmitted to a cooler through a metal joint, a ceramic substrate, and a heat transfer sheet.

CITATION LIST

Patent Literature

PTL 1: JP 2018-26370 A

SUMMARY OF INVENTION

Technical Problem

The power module described in PTL 1 has required an expensive ceramic substrate.

Solution to Problem

The electric circuit body according to the present invention includes a circuit body having a first power semiconductor element that is sandwiched between a first conductor plate on one surface thereof and a second conductor plate on the other surface thereof, a cooling member disposed on both surfaces of the circuit body, a sheet-shaped member adhered to at least the second conductor plate and having at least a resin insulating layer, and a metal-based heat conduction member provided between the sheet-shaped member and the cooling member so as to be in contact with the sheet-shaped member and the cooling member.

In the method for manufacturing the electric circuit body, the first power semiconductor element is sandwiched between the first conductor plate on one surface thereof and the second conductor plate on the other surface thereof, the second power semiconductor element is sandwiched between the third conductor plate on one surface thereof and the fourth conductor plate on the other surface thereof, the sheet-shaped member having at least the resin insulating layer is adhered to the second conductor plate and the fourth conductor plate so as to cover at least the second conductor plate and the fourth conductor plate, the metal-based heat conduction member having regions having different thicknesses is adhered to the sheet-shaped member along the arrangement direction of the first power semiconductor element and the second power semiconductor element, and the cooling member is brought into close contact with the metal-based heat conduction member.

ADVANTAGEOUS EFFECTS OF INVENTION

According to the present invention, heat dissipation can be improved without using a ceramic substrate.

DESCRIPTION OF EMBODIMENTS

Figure 1:
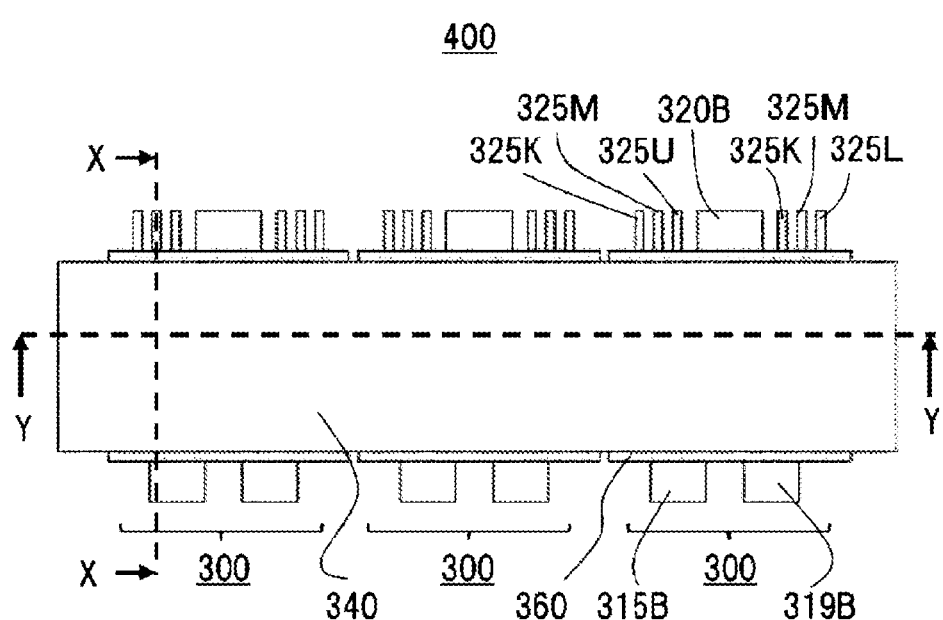
FIG. 1 is a plan view of an electric circuit body.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, the number of each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

Figure 2:
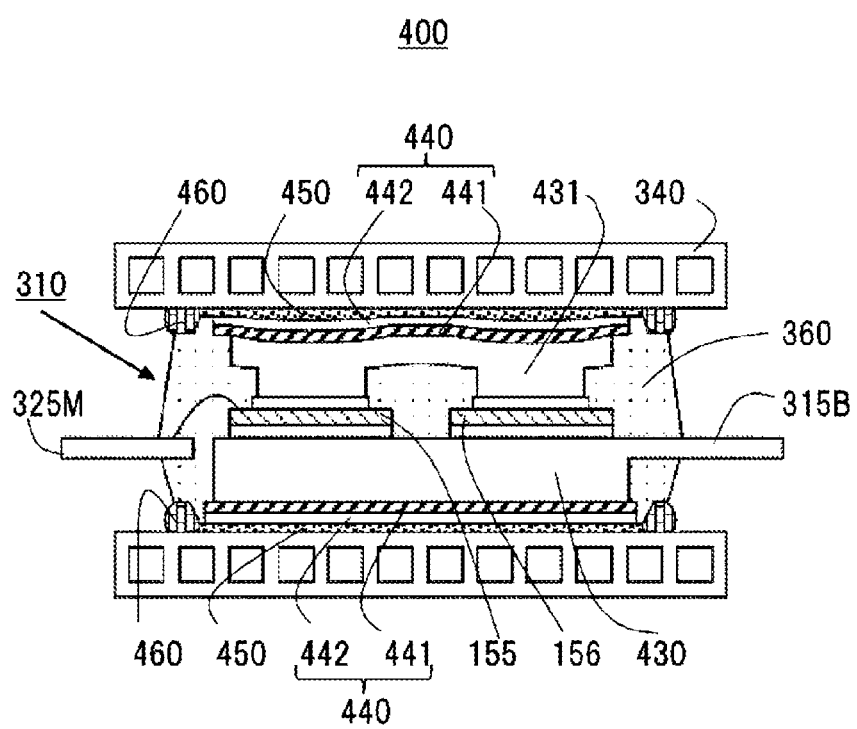
FIG. 2 is a cross-sectional view of the electric circuit body taken along line X-X.
Figure 3:
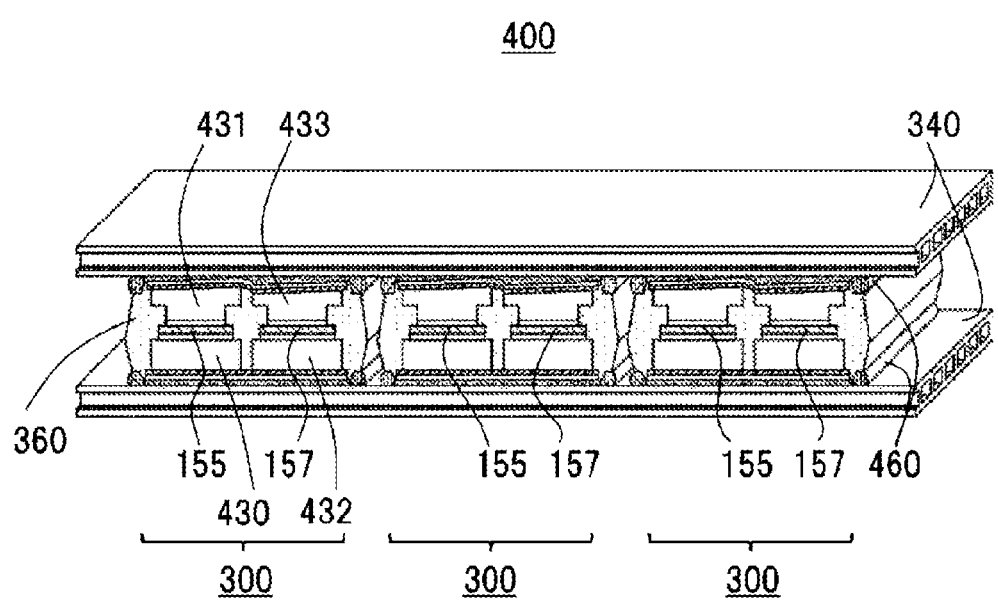
FIG. 3 is a cross-sectional view of the electric circuit body taken along line Y-Y.

FIG. 1 is a plan view of an electric circuit body 400 according to the present embodiment, and FIG. 2 is a cross-sectional view of the electric circuit body 400 taken along line X-X illustrated in FIG. 1. FIG. 3 is a cross-sectional view of the electric circuit body 400 taken along line Y-Y illustrated in FIG. 1.

As illustrated in FIG. 1, the electric circuit body 400 includes three power modules 300 and a cooling member 340. The power module 300 has a function of converting direct current and alternating current using a semiconductor element, and generates heat by energization. Therefore, the cooling member 340 is configured to cool a refrigerant by circulating the refrigerant therethrough. As the refrigerant, water, an antifreeze fluid in which ethylene glycol is mixed in water, or the like is used. It should be understood that the cooling member 340 may have a configuration in which pin-shaped fins are erected on a base plate of the cooling member 340. In addition, the cooling member 340 may be provided with unevenness on a contact surface with a metal-based heat conduction member 450 to be described later so as to bite into the metal-based heat conduction member 450.

The power module 300 includes power terminals through which a large current flows, such as a positive electrode side terminal 315B and a negative electrode side terminal 319B connected to a capacitor module 500 (see FIG. 11 described later) of a DC circuit, and an AC side terminal 320B connected to motor generators 192 and 194 (see FIG. 11 described later) of an AC circuit. The power module 300 also includes signal terminals used for controlling the power module, such as a lower arm gate signal terminal 325L, a mirror emitter signal terminal 325M, a Kelvin emitter signal terminal 325K, an upper arm gate signal terminal 325U, a mirror emitter signal terminal 325M, and a Kelvin emitter signal terminal 325K.

As illustrated in FIG. 2, a first active element 155 and a first diode 156 are provided as first power semiconductor elements which form an upper arm circuit. The first active element 155 is, for example, an IGBT, a MOSFET, or the like, and when it is a MOSFET, the first diode 156 is unnecessary. As the semiconductor material constituting the first active element 155, for example, Si, SiC, GaN, GaO, C, or the like can be used.

When a body diode of the active element is used, the first diode 156 may be omitted.

The same applies to a semiconductor material constituting a second active element 157 to be described later.

A collector side of the first active element 155 and a cathode side of the first diode 156 are joined to a first conductor plate 430. For this junction, solder or sintered metal may be used. The first conductor plate 430 is not particularly limited as long as it is made of a material having high electrical conductivity and thermal conductivity, but a copper-based or aluminum-based material is desirable. These materials may be used alone, but may be plated with Ni, Ag, or the like in order to improve joining properties such as soldering or joining of a sintered metal.

An emitter side of the first active element 155 and an anode side of the first diode 156 are joined to a second conductor plate 431. That is, the first active element 155 is sandwiched by the first conductor plate 430 on one surface thereof and the second conductor plate 431 on the other surface thereof to thereby constitute a circuit body 310.

Figure 4:
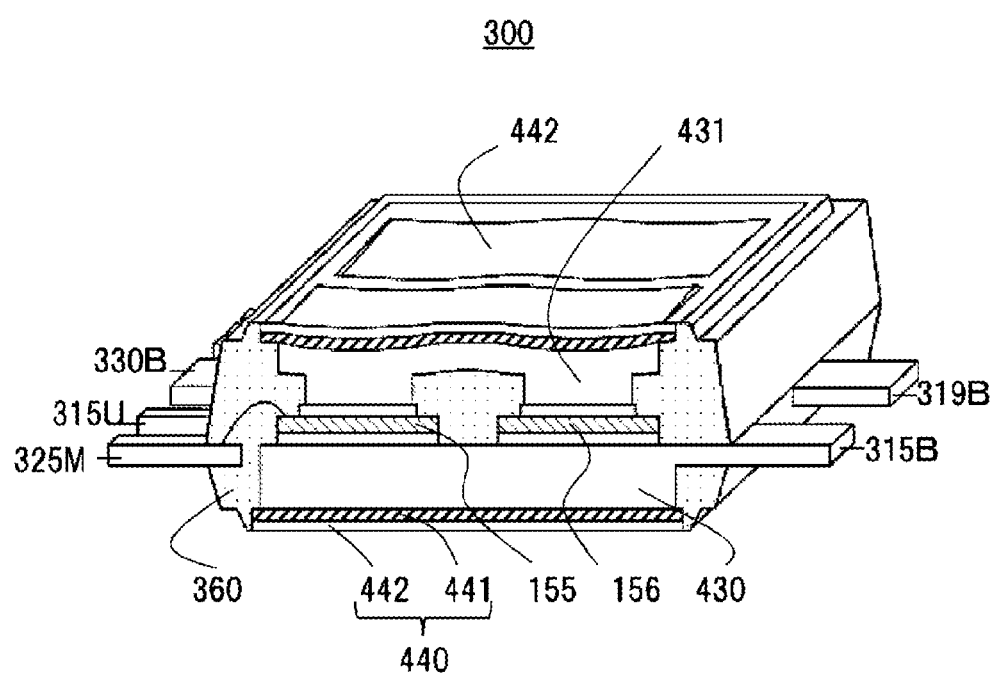
FIG. 4 is a cross-sectional perspective view of a power module taken along line X-X.

FIG. 4 is a cross-sectional perspective view of the power module 300 taken along line X-X illustrated in FIG. 1, and illustrates a state in which the cooling member 340 and the metal-based heat conduction member 450 have been removed from the electric circuit body 400. As illustrated in FIG. 4, the second conductor plate 431 has a recess on the outer periphery of a region connected to the first active element 155 and the first diode 156 to secure an insulation distance. This recess is desirably formed by press working for cost reduction. When a recess is provided by press working, the back surface thereof is deformed corresponding to the recess. Therefore, as illustrated in FIG. 2, the second conductor plate 431 has a predetermined warpage amount, for example, a warpage of 40 μm on a side in contact with the cooling member 340.

As illustrated in FIG. 3, a second active element 157 and a second diode 158 (see FIGS. 9 and 10 described later) are provided as second power semiconductor elements which form a lower arm circuit. It should be understood that the second diode 158 is disposed on the back side of the second active element 157 illustrated in FIG. 3. A collector side of the second active element 157 and a cathode side of the second diode 158 are joined to a third conductor plate 432. An emitter side of the second active element 157 and an anode side of the second diode 158 are joined to a fourth conductor plate 433. Similarly to the second conductor plate 431, the fourth conductor plate 433 has a warpage on the side in contact with the cooling member 340. In addition, since the second conductor plate 431 and the fourth conductor plate 433 are independent conductor plates, these conductor plates have different inclinations at the time of joining to the power semiconductor elements. As described above, the second conductor plate 431 and the fourth conductor plate 433 not only have a warpage of a predetermined warpage amount (for example, 40 μm) on the side in contact with the cooling member 340 as a single body, but also have a step difference on the side in contact with the cooling member 340 when viewed from the first power semiconductor element (first active element 155) toward a direction in which the second power semiconductor element (second active element 157) is arranged as illustrated in FIG. 3, and the maximum height variation is, for example, 120 μm.

In general, when the second conductor plate 431 and the fourth conductor plate 433 are brought into contact with the cooling member 340 via an insulating layer alone, if the thickness of the insulating layer capable of securing insulation properties is set to 120 μm, the thickness of the insulating layer needs to be increased to 240 μm in order to absorb the variation in height of 120 μm caused by the step difference or the warpage. Since the insulating layer is lower in thermal conductivity than the metal, increasing the thickness of the insulating layer increases thermal resistance and significantly reduces heat dissipation.

By contrast, in the present embodiment, as illustrated in FIG. 2, a sheet-shaped member 440 having a resin insulating layer 441 and a metal foil 442 is used. The sheet-shaped member 440 is deformed following the warpage or the step difference in the second conductor plate 431 and the fourth conductor plate 433, and therefore, the thickness of the resin insulating layer 441 can be set to a constant thickness of, for example, 120 μm capable of securing insulation properties. By plastically deforming the metal-based heat conduction member 450 having a thickness of, for example, 120 μm interposed between the sheet-shaped member 440 and the cooling member 340, the thickness of the metal-based heat conduction member 450 is changed to absorb the warpage or step difference generated in the second conductor plate 431 and the fourth conductor plate 433. This results in remarkable improvement in heat dissipation as compared with the case where the conductor plates are brought into contact with the cooling member 340 via the insulating layer alone. The resin insulating layer 441 of the sheet-shaped member 440 is not particularly limited as long as it has adhesiveness with the second conductor plate 431 and the fourth conductor plate 433, but an epoxy resin-based resin insulating layer in which a powdery inorganic filler is dispersed is desirable. This is because adhesiveness and heat dissipation are well-balanced.

The circuit body 310 is configured such that the first active element 155 is sandwiched by the first conductor plate 430 on one surface thereof and the second conductor plate 431 on the other surface thereof, and further, both surfaces of the circuit body 310 are sandwiched by the sheet-shaped members 440 to thereby form the power module 300.

The sheet-shaped member 440 may be the resin insulating layer 441 alone, but it is desirable to provide the metal foil 442 on a side in contact with the metal-based heat conduction member 450. The metal foil 442 is metal-joined to the metal-based heat conduction member 450. By providing the metal foil 442, there is an effect capable of preventing the not yet cured resin insulating layer 441 from being broken when the sheet-shaped member 440 is deformed following the warpage or the step difference in the second conductor plate 431 and the fourth conductor plate 433. The type of the metal foil 442 is not particularly limited, but an aluminum-based metal foil or a copper-based metal foil is desirable. In particular, the copper-based metal foil has an effect capable of reducing contact thermal resistance by forming an alloy layer with the metal-based heat conduction member 450. The cooling member 340 is desirably made of aluminum having high thermal conductivity and light weight.

The cooling member 340 is manufactured by extrusion molding, forging, brazing, or the like.

The metal-based heat conduction member 450 is not particularly limited as long as it is a material having a lower yield point than the cooling member 340 at a temperature of 200° C. or lower, but a material having a lower Young's modulus than the cooling member 340 is more preferable. When the yield point is unclear, the 0.2% proof stress may be applied in comparison. This is because the metal-based heat conduction member 450 is plastically deformed by heating and pressurizing the metal-based heat conduction member 450 via the cooling member 340. The plastically deformed metal-based heat conduction member 450 has regions having different thicknesses according to the warpage amount of the second conductor plate 431 or the fourth conductor plate 433 along an arrangement direction of the first active element 155 and the first diode 156, and an arrangement direction of the second active element 157 and the second diode 158 (horizontal direction in FIG. 4). It also has regions having different thicknesses according to the step difference between the second conductor plate 431 and the fourth conductor plate 433 along an arrangement direction of the first active element 155 and the second active element 157 and an arrangement direction of the second active element 157 and the second diode 158 (depth direction in FIG. 2).

As the metal-based heat conduction member 450, an aluminum-based alloy, a tin-based alloy, a magnesium-based alloy, an indium-based alloy, a silver-based alloy, a gold-based alloy, or pure metals thereof can be used. Among them, indium is preferable because although expensive, indium has a low Young's modulus and a low yield point. On the other hand, the tin-based alloy is most preferable because it has a higher Young's modulus and a higher yield point than indium, and has a lower Young's modulus and a lower yield point than the aluminum-based cooling member.

The power module 300 is formed such that both surfaces of the circuit body 310 are sandwiched by the sheet-shaped members 440, and further, the metal-based heat conduction member 450 is adhered to the sheet-shaped member 440, and the cooling member 340 is brought into close contact with the metal-based heat conduction member 450 to thereby form the electric circuit body 400.

As illustrated in FIGS. 2 to 4, the power semiconductor elements and a portion of the first conductor plate 430 to the fourth conductor plate 433 are covered and protected with a sealing resin 360 by transfer molding.

The transfer molding may be performed including the sheet-shaped member 440, or the sheet-shaped member 440 may be adhered after the transfer molding. The transfer molding including the sheet-shaped member 440 has an effect of improving reliability by covering the end portion of the sheet-shaped member 440 with the sealing resin 360.

As illustrated in FIGS. 2 and 3, the outer periphery of the metal-based heat conduction member 450 may be sealed with an adhesive member 460. This allows the metal-based heat conduction member 450 to be held in close contact with the cooling member 340. In addition, sealing with the adhesive member 460 makes it possible to prevent a portion of the metal-based heat conduction member 450 from scattering around. By providing a step difference on the outer peripheral portion of the sealing resin 360, it is possible to prevent the adhesive member 460 from entering between the metal-based heat conduction members 450. The adhesive member 460 is not particularly limited as long as it is an insulating material having adhesiveness, but a material having a thixotropy of 1.5 or higher obtained by dividing the viscosity at a shear rate of 1 (1/ s) by the viscosity at a shear rate of 10 (1/ s) is desirable so as to reduce outflow from the applied surface. Among them, a silicone resin or an epoxy resin is desirable. In particular, a silicone resin is desirable because it has a low elastic modulus and thus has low thermal stress.

FIGS. 5(a) to 5(e) and FIGS. 6(f) to 6(h) are cross-sectional views illustrating a method for manufacturing the electric circuit body 400 of the present embodiment. The cross section taken along line X-X illustrated in FIG. 1 is illustrated on the left side of each drawing, and one power module of the cross section taken along line Y-Y illustrated in FIG. 1 is illustrated on the right side of each drawing.

Figure 5:
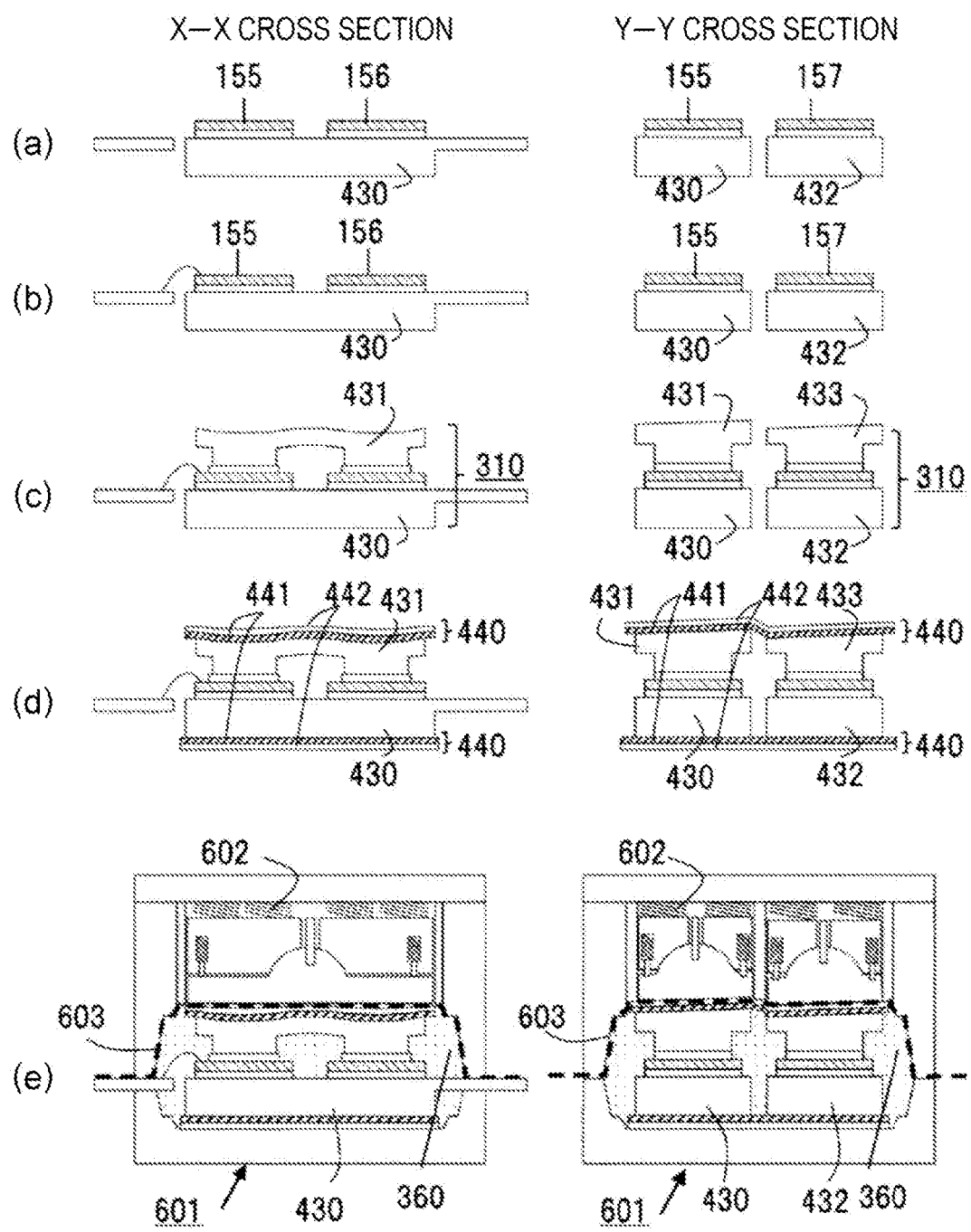
FIGS. 5(a) to 5(e) are cross-sectional views illustrating a method for manufacturing an electric circuit body.

FIG. 5(a) illustrates a solder connection process to the first conductor plate 430 and the third conductor plate 432. The collector side of the first active element 155 and the cathode side of the first diode 156 are connected to the first conductor plate 430. In addition, the collector side of the second active element 157 and the cathode side of the second diode 158 are connected to the third conductor plate 432. It should be understood that the second diode 158 is disposed on the back side of the second active element 157.

FIG. 5(b) illustrates a wire bonding process. Gate electrodes of the first active element 155 and the second active element 157 are connected.

FIG. 5(c) illustrates a solder connection process to the second conductor plate 431 and the fourth conductor plate 433. The emitter side of the first active element 155 and the anode side of the first diode 156 are connected to the second conductor plate 431. The emitter side of the second active element 157 and the anode side of the second diode 158 are connected to the fourth conductor plate 433. Thus, the circuit body 310 is formed.

FIG. 5(d) illustrates a press-contact process of the sheet-shaped member 440. The sheet-shaped member 440 is adhered to each conductor plate so as to sandwich the first conductor plate 430 and the third conductor plate 432, and the second conductor plate 431 and the fourth conductor plate 433 from both sides. Although the sheet-shaped member 440 is configured as one sheet-shaped member 440 to cover the second conductor plate 431 and the fourth conductor plate 433, separate sheet-shaped members 440 may individually cover the second conductor plate 431 and the fourth conductor plate 433.

FIG. 5(e) illustrates a transfer molding process. In a transfer molding device 601 including a spring 602 and a cushion sheet 603, the sheet-shaped member 440 covering the second conductor plate 431 and the fourth conductor plate 433 is integrally molded in the transfer molding process. In addition, in the transfer molding process, the sealing resin 360 is injected by pressurizing the surface of the sheet-shaped member 440 so that the sealing resin 360 does not flow around.

Figure 6:
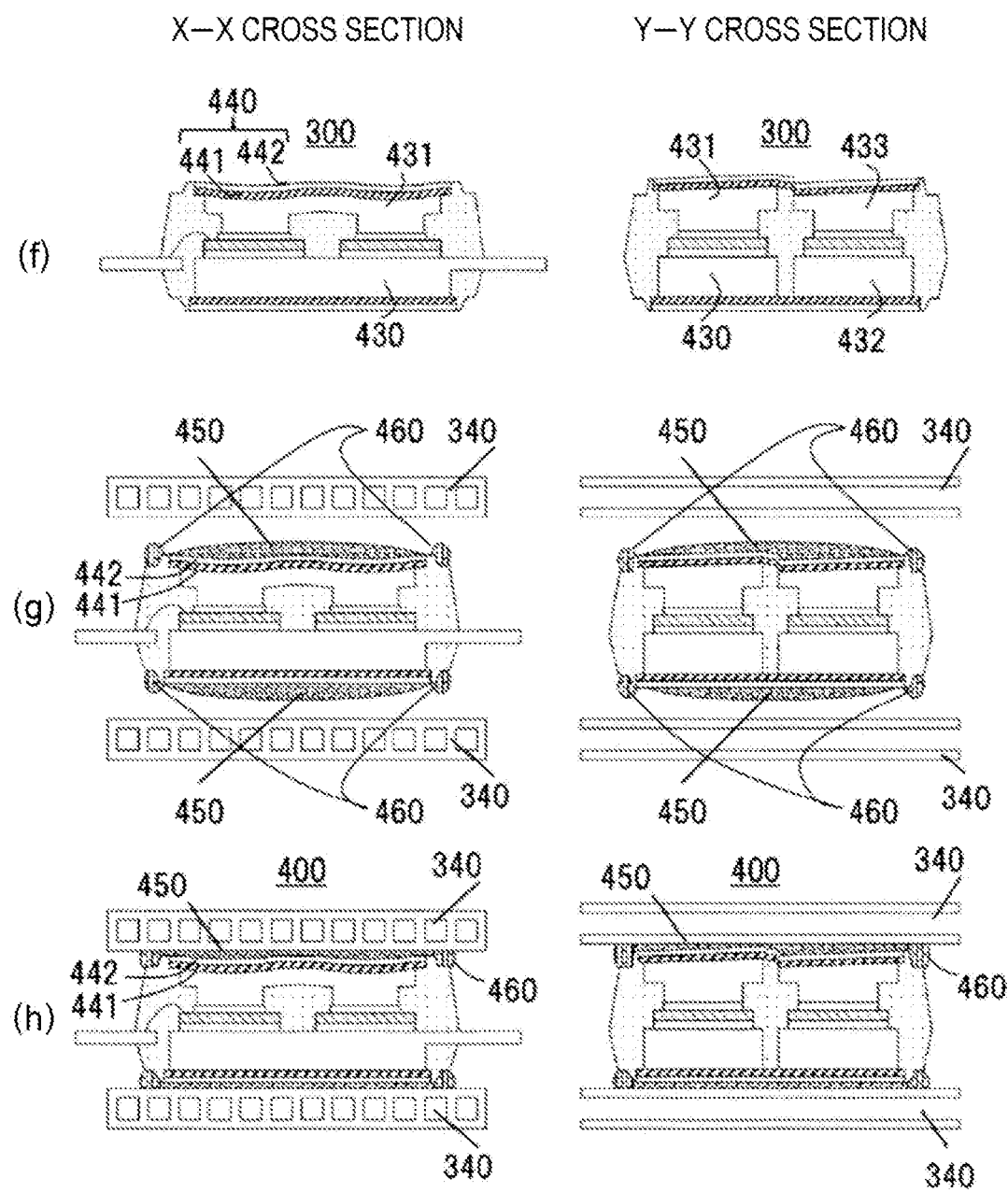
FIGS. 6(f) to 6(h) are cross-sectional views illustrating the method for manufacturing the electric circuit body.

FIG. 6(f) illustrates a tie bar cutting process. The molded product is taken out from the transfer molding device 601 and a tie bar (not illustrated) is cut to form terminals. As a result, the power module 300 in which terminals are formed and the sheet-shaped member 440 including the resin insulating layer 441 and the metal foil 442 is provided is formed.

FIG. 6(g) illustrates processes of placing the metal-based heat conduction member 450 and applying the adhesive member 460. The metal-based heat conduction member 450 is placed on the sheet-shaped member 440, and heated and pressurized to form an alloy layer at an interface between the metal-based heat conduction member 450 and the metal foil 442, and then the adhesive member 460 is applied. By forming the alloy layer at the interface of the metal foil 442, the contact thermal resistance with the metal-based heat conduction member 450 can be reduced. In the cross-sectional shape of the metal-based heat conduction member 450, a central portion is formed thick, and both ends are formed thin. Both ends of the metal-based heat conduction member 450 are in contact with the adhesive member 460.

Although the metal-based heat conduction member 450 has been described by taking one sheet member covering the second conductor plate 431 and the fourth conductor plate 433 as an example, the metal-based heat conduction member may be a member covering each of the second conductor plate 431 and the fourth conductor plate 433. In that case, as described above, the second conductor plate 431 and the fourth conductor plate 433 are preferably covered with the separate sheet-shaped members 440. That is, in the metal-based heat conduction member 450, a portion in contact with the sheet-shaped member 440 adhered to the second conductor plate 431 and a portion in contact with the sheet-shaped member 440 adhered to the fourth conductor plate 433 may be provided separately from each other. Even in this case, by plastically deforming these portions of the metal-based heat conduction member 450, warpage or step difference generated in the second conductor plate 431 and the fourth conductor plate 433 can be absorbed, and heat dissipation can be improved.

FIG. 6(h) illustrates a close contact process of the cooling member 340. The cooling member 340 is brought into close contact with the metal-based heat conduction member 450 and the adhesive member 460. At this time, by heating and pressurizing, the contact thermal resistance between the cooling member 340 and the metal-based heat conduction member 450 is reduced, and the adhesive member 460 is cured. Thus, the electric circuit body 400 is formed.

Figure 7:
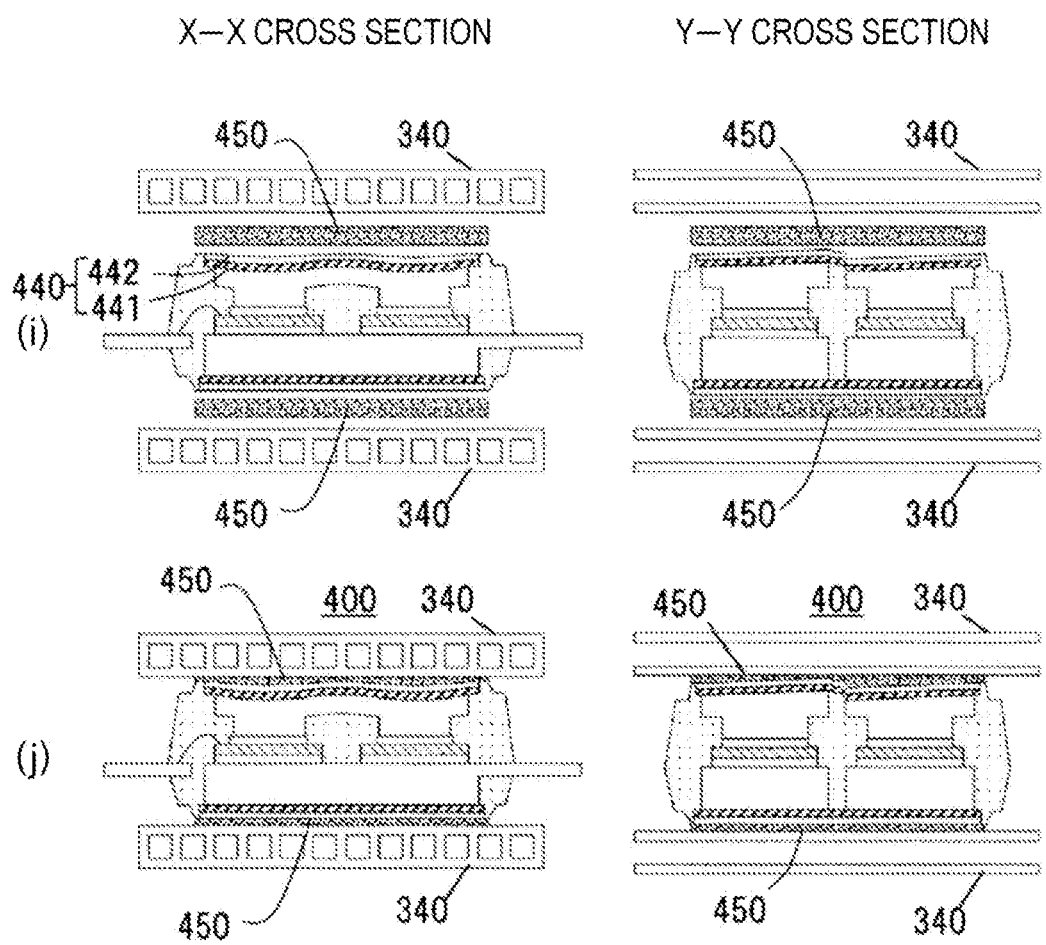
FIGS. 7(i) to 7(j) are cross-sectional views illustrating modification 1 of the method for manufacturing the electric circuit body.

FIGS. 7(i) to 7(j) are cross-sectional views illustrating modification 1 of the method for manufacturing the electric circuit body 400 of the present embodiment. The cross section taken along line X-X illustrated in FIG. 1 is illustrated on the left side of each drawing, and one power module of the cross section taken along line Y-Y illustrated in FIG. 1 is illustrated on the right side of each drawing.

The same applies to the manufacturing method in modification 1 up to FIG. 6(f) described above, and a description thereof will be omitted.

FIG. 7(i) illustrates a placement process of the metal-based heat conduction member 450. The metal-based heat conduction member 450 is placed on the sheet-shaped member 440. In Modification 1, the adhesive member 460 is not used. The metal-based heat conduction member 450 has a rectangular parallelepiped cross section.

FIG. 7(j) illustrates a close contact process of the cooling member 340. The cooling member 340 is brought into close contact with the metal-based heat conduction member 450. At this time, heating and pressurization reduce the contact thermal resistance between the cooling member 340 and the metal-based heat conduction member 450. Thus, the electric circuit body 400 is formed.

FIGS. 8(k) to 8(n) are cross-sectional views illustrating modification 2 of the method for manufacturing the electric circuit body of the present embodiment. The cross section taken along line X-X illustrated in FIG. 1 is illustrated on the left side of each drawing, and one power module of the cross section taken along line Y-Y illustrated in FIG. 1 is illustrated on the right side of each drawing.

The same applies to the manufacturing method in modification 2 up to FIG. 6(f) described above, and a description thereof will be omitted.

Figure 8:
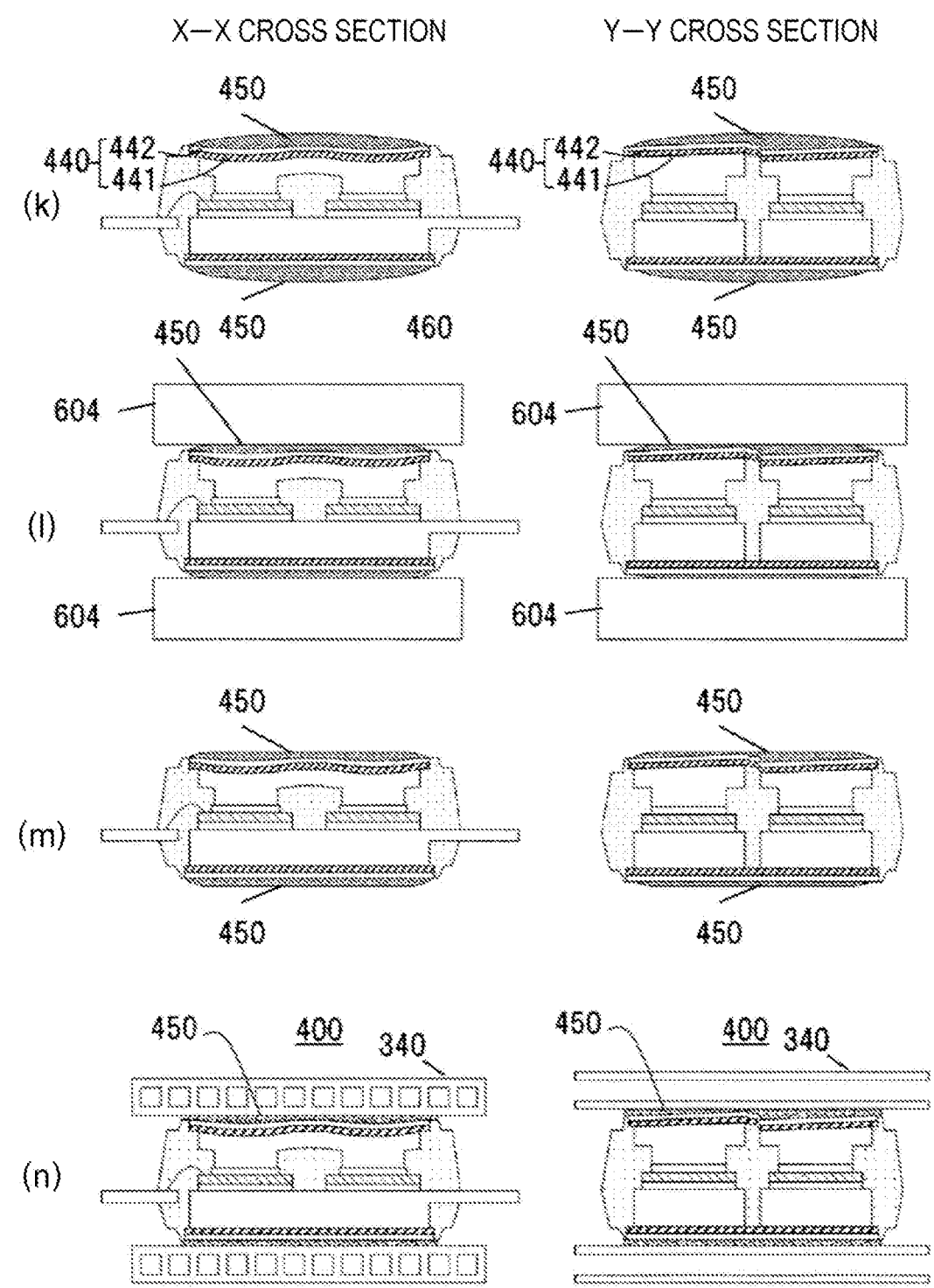
FIGS. 8(k) to 8(n) are cross-sectional views illustrating modification 2 of the method for manufacturing the electric circuit body.

FIG. 8(k) illustrates an application process of the metal-based heat conduction member 450. The melted metal-based heat conduction member 450 is applied to the sheet-shaped member 440. By applying the melted metal-based heat conduction member 450, the metal foil 442 and the alloy layer can be formed, and the contact thermal resistance can be reduced. In addition, the application of the melted metal-based heat conduction member 450 can achieve cost reduction as compared with the case where the metal-based heat conduction member is placed in a sheet shape.

FIG. 8(l) illustrates a planarization process of the metal-based heat conduction member 450. The applied metal-based heat conduction member 450 is planarized in a molten state using a heated deformation jig 604.

FIG. 8(m) illustrates a cross section of the planarized metal-based heat conduction member 450.

FIG. 8(n) illustrates a close contact process of the cooling member 340. The cooling member 340 is brought into close contact with the metal-based heat conduction member 450. At this time, heating and pressurization reduce the contact thermal resistance between the cooling member 340 and the metal-based heat conduction member 450. Thus, the electric circuit body 400 is formed.

Figure 9:
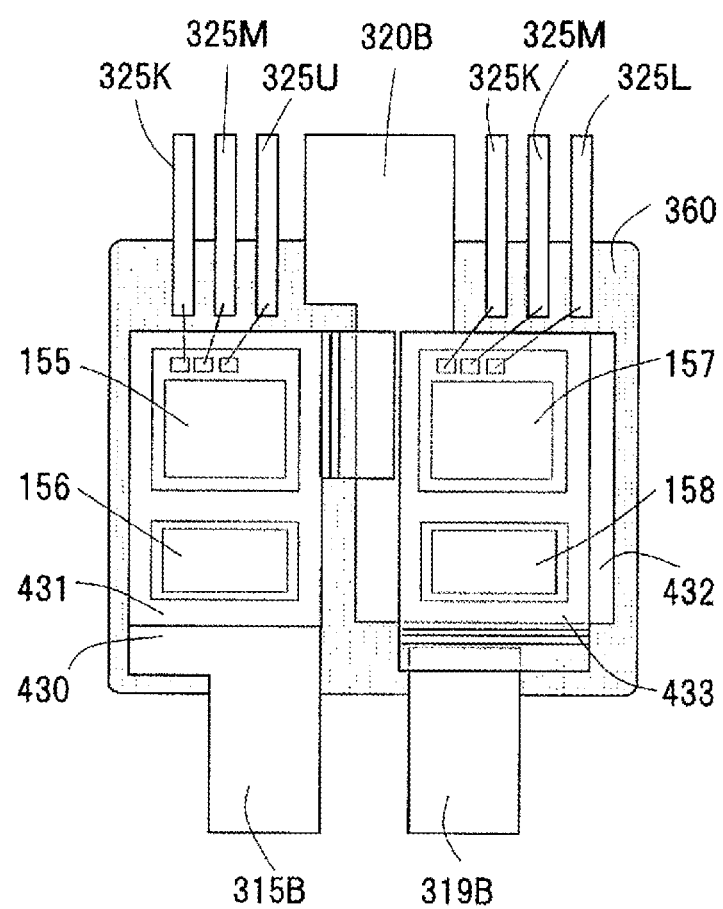
FIG. 9 is a semi-transparent plan view of the power module.
Figure 10:
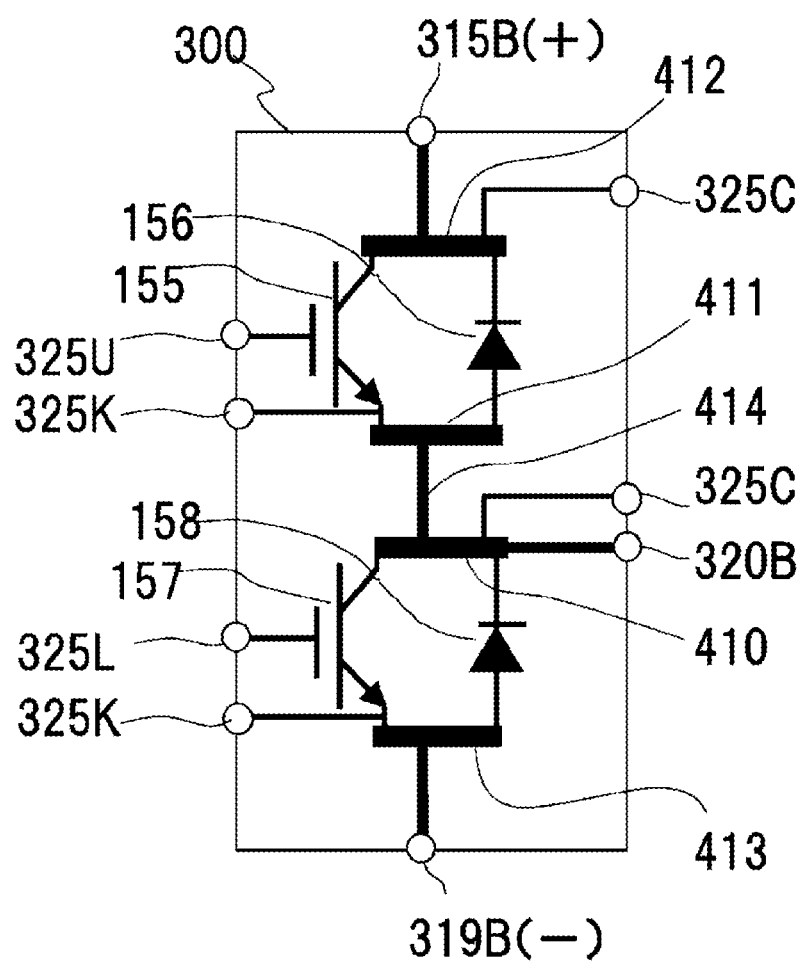
FIG. 10 is a circuit diagram illustrating an example of a circuit of the power module.

FIG. 9 is a semi-transparent plan view of the power module 300. Although three power modules 300 are illustrated in FIG. 1, FIG. 9 illustrates one power module 300 as an example. FIG. 10 is a circuit diagram of one power module 300.

As illustrated in FIGS. 9 and 10, the upper arm circuit includes a first active element 155 and a first diode 156 of the upper arm circuit. The lower arm circuit includes a second active element 157 and a second diode 158 of the lower arm circuit. The first active element 155 and the second active element 157 are, for example, IGBTs.

As shown in FIGS. 9 and 10, the positive electrode side terminal 315B is output from the collector side of the upper arm circuit, and the positive electrode side terminal 315B is connected to the positive electrode side of a battery or a capacitor. The upper arm gate signal terminal 325U is output from the gate and emitter sense of the first active element 155 of the upper arm circuit. The negative electrode side terminal 319B is output from the emitter side of the lower arm circuit, and the negative electrode side terminal 319B is connected to the negative electrode side of the battery or the capacitor or a GND. The lower arm gate signal terminal 325L is output from the gate and emitter sense of the second active element 157 of the lower arm circuit. The AC side terminal 320B is output from the collector side of the lower arm circuit and is connected to a motor. When the neutral point is grounded, the lower arm circuit is connected not to the GND but to the negative electrode side of the capacitor.

As illustrated in FIG. 9, terminals such as a Kelvin emitter signal terminal 325K, a lower arm gate signal terminal 325L, a mirror emitter signal terminal 325M, and an upper arm gate signal terminal 325U are provided. In addition, a first conductor plate 430 is provided on the upper arm circuit collector side, a second conductor plate 431 is provided on the upper arm circuit emitter side, a third conductor plate 432 is provided on the lower arm circuit collector side, and a fourth conductor plate 433 is provided on the lower arm circuit emitter side, and are sealed with the sealing resin 360.

The power module of the present embodiment has a 2-in-1 structure in which two arm circuits of an upper arm circuit and a lower arm circuit are integrated into one power module. In addition to the 2-in-1 structure, a 3-in-1 structure in which three arm circuits are integrated into one power module, a 4-in-1 structure in which four arm circuits are integrated into one power module, a 6-in-1 structure in which six arm circuits are integrated into one power module, or the like may be used. When these structures are used, the number of output terminals from the power module can be reduced and downsized.

Further, in the present embodiment, the structure in which two arm circuits of the upper arm circuit and the lower arm circuit are integrated into one power module has been described, but the present embodiment may be applied to a structure in which the upper arm circuit or the lower arm circuit is integrated into one power module. That is, when the power module including at least one power semiconductor element and the power semiconductor element sandwiched between the conductor plates disposed on both surfaces of the power semiconductor element and the cooling member are bonded to each other, by using the sheet-shaped member 440 and the metal-based heat conduction member 450 described in the present embodiment, it is possible to absorb the warpage or the step difference of the conductor plate at the bonding surface with the cooling member. This makes it possible to constitute an electric circuit body having improved heat dissipation as compared with a conventional structure.

Figure 11:
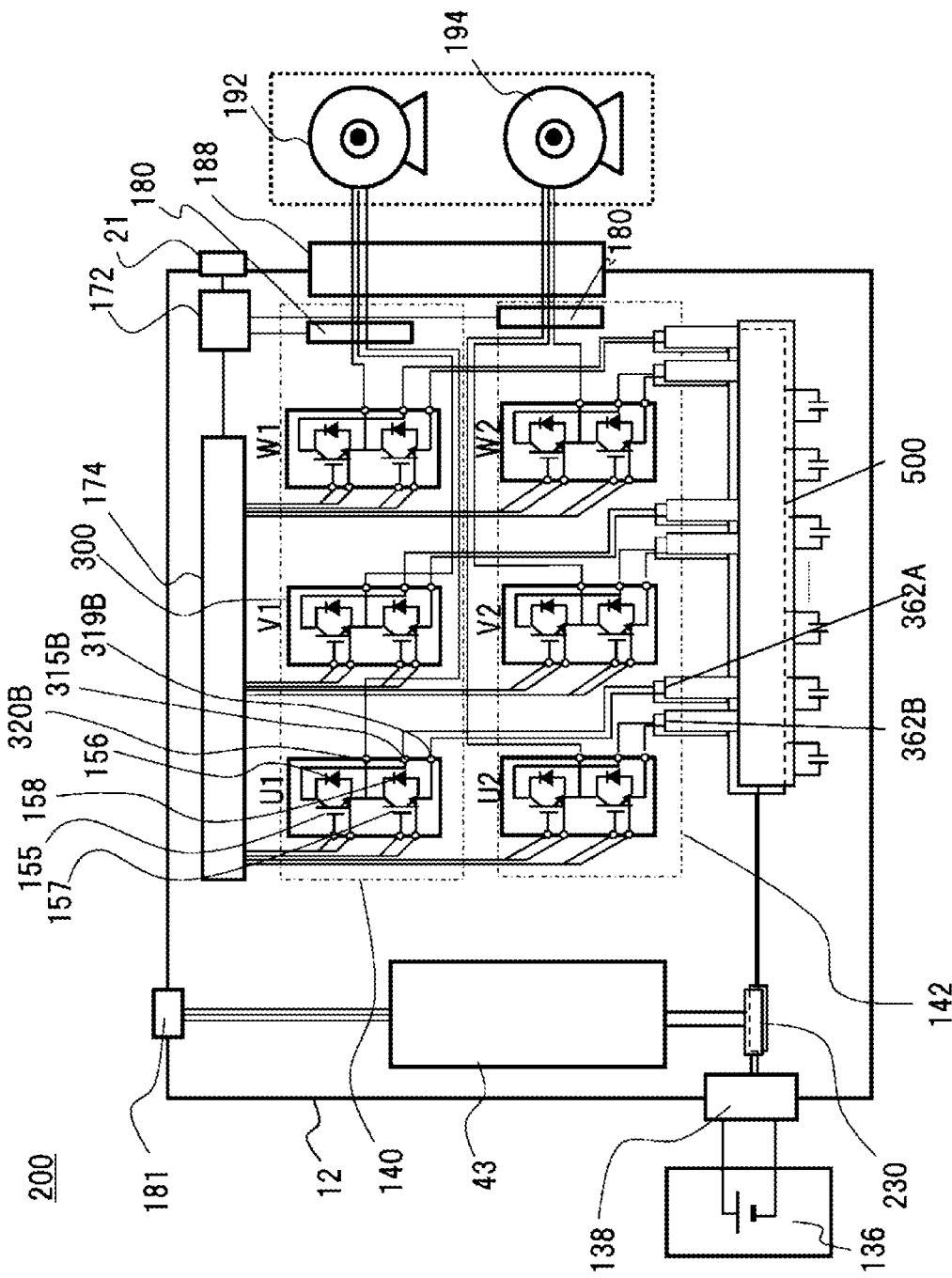
FIG. 11 is a circuit diagram of a power converter using the power module.

FIG. 11 is a circuit diagram of a power converter 200 using the power module.

As illustrated in FIG. 11, the power converter 200 includes inverter circuit units 140, 142, an auxiliary inverter circuit unit 43, and a capacitor module 500.

The inverter circuit units 140 and 142 include a plurality of power modules 300, and a three-phase inverter circuit is configured by connecting the power modules. When the current capacity is large, the power modules 300 are further connected in parallel, and these parallel connections are performed corresponding to the respective phases of the three-phase inverter circuit, so that it is possible to cope with an increase in the current capacity. In addition, by connecting the active elements 155, 157 and the diodes 156, 158, which are power semiconductor elements incorporated in the power module 300, in parallel, it is also possible to cope with an increase in current capacity.

The inverter circuit unit 140 and the inverter circuit unit 142 have the same basic circuit configuration, and also basically have the same control method and operation. Since the outline of the circuit operation of the inverter circuit unit 140 and the like is well known, a detailed description thereof will be omitted here.

The upper arm circuit includes an active element 155 for the upper arm and a diode 156 for the upper arm as power semiconductor elements for switching, and the lower arm circuit includes an active element 157 for the lower arm and a diode 158 for the lower arm as power semiconductor elements for switching. The active elements 155 and 157 perform switching operation in response to a drive signal output from one or the other of two driver circuits constituting a driver circuit 174, convert DC power supplied from a battery 136 into three-phase AC power, and drive the motor generators 192 and 194.

The active element 155 for the upper arm and the active element 157 for the lower arm include a collector electrode, an emitter electrode, and a gate electrode. The diode 156 for the upper arm and the diode 158 for the lower arm include two electrodes of a cathode electrode and an anode electrode. As illustrated in FIG. 3, the cathode electrodes of the diodes 156, 158 are electrically connected to the collector electrodes of the active elements (IGBTs) 155, 157, and the anode electrodes are electrically connected to the emitter electrodes of the active elements 155, 157, respectively. As a result, the current flows in the forward direction from the emitter electrode to the collector electrode of the active element 155 for the upper arm and the active element 157 for the lower arm.

It should be understood that a metal oxide semiconductor field effect transistor (MOSFET) may be used as the active element, and in this case, the diode 156 for the upper arm and the diode 158 for the lower arm become unnecessary.

The positive electrode side terminal 315B and the negative electrode side terminal 319B of each of the upper and lower arm series circuits are connected to DC terminals 362A, 362B for capacitor connection of the capacitor module 500, respectively. AC power is generated at the connection portions of the upper arm circuit and the lower arm circuit, and the connection portions of the upper arm circuit and the lower arm circuit in the upper and lower arm series circuits are connected to the AC side terminals 320B of the power modules 300. The AC side terminal 320B of each power module 300 of each phase is connected to the AC output terminal of the power converter 200, and the generated AC power is supplied to a stator winding of the motor generator 192 or 194.

The control circuit 172 generates a timing signal for controlling switching timing of the active element 155 for the upper arm and the active element 157 for the lower arm based on input information from a control device, a sensor (for example, a current sensor 180), or the like on a vehicle side. The driver circuit 174 generates a drive signal for switching the active element 155 for the upper arm and the active element 157 for the lower arm based on the timing signal output from the control circuit 172.

It should be understood that reference numerals 181, 182, and 188 denote connectors.

The upper and lower arm series circuits include a temperature sensor (not illustrated), and temperature information of the upper and lower arm series circuits is input to the control circuit 172. Voltage information on a DC positive side of the upper and lower arm series circuits is also input to the control circuit 172. The control circuit 172 performs overtemperature detection and overvoltage detection based on these pieces of information, stops the switching operation of all the active elements 155 for the upper arm and the active elements 157 for the lower arm when overtemperature or overvoltage is detected, and protects the upper and lower arm series circuits from overtemperature or overvoltage.

Figure 12:
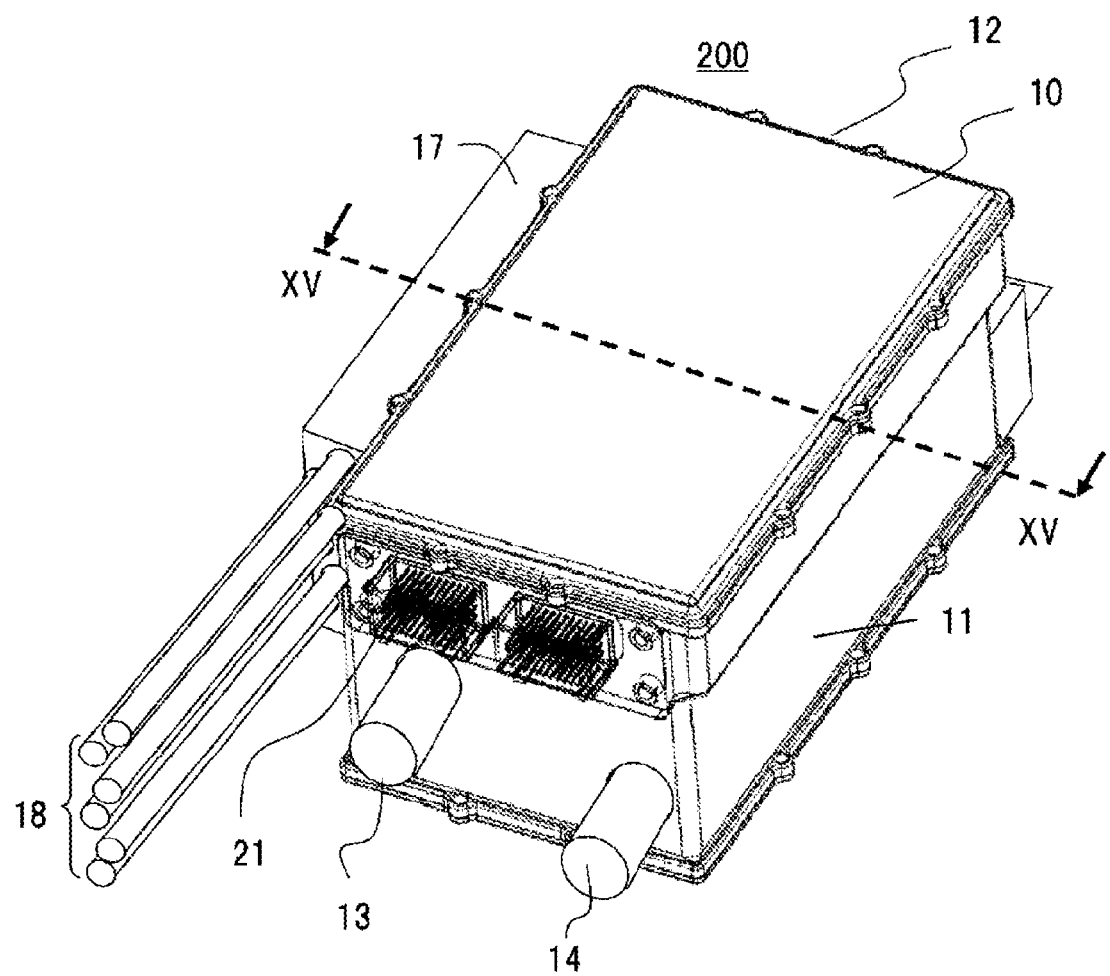
FIG. 12 is an external perspective view illustrating an example of the power converter.
Figure 13:
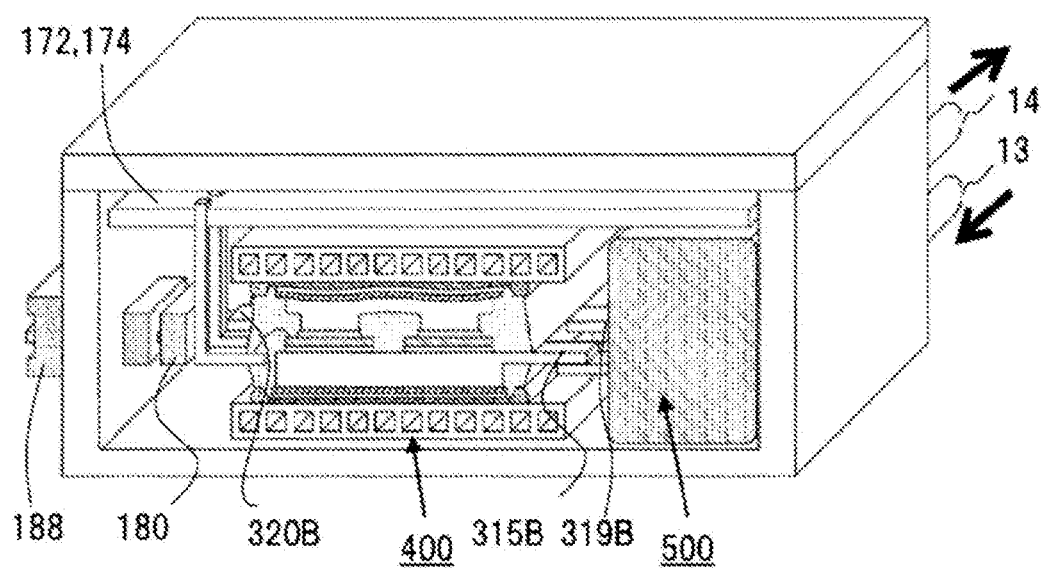
FIG. 13 is a cross-sectional perspective view of the power converter taken along line XV-XV.

FIG. 12 is an external perspective view illustrating an example of the power converter illustrated in FIG. 11, and FIG. 13 is a cross-sectional view taken along line XV-XV of the power converter illustrated in FIG. 12.

As illustrated in FIG. 12, the power converter 200 includes a housing 12 that is configured by a lower case 11 and an upper case 10 and is formed in a substantially rectangular parallelepiped shape. The housing 12 accommodates the electric circuit body 400, the capacitor module 500, and the like therein. The electric circuit body 400 has a cooling flow path, and a cooling water inflow pipe 13 and a cooling water outflow pipe 14 that communicate with the cooling flow path protrude from one side surface of the housing 12. As illustrated in FIG. 12, the lower case 11 has an opening on the upper side (Z direction), and the upper case 10 is attached to the lower case 11 by closing the opening of the lower case 11. The upper case 10 and the lower case 11 are formed of an aluminum alloy or the like, and are sealed and fixed to the outside. The upper case 10 and the lower case 11 may be integrated. Since the housing 12 has a simple rectangular parallelepiped shape, attachment to a vehicle or the like is facilitated, and manufacturing is also facilitated.

As illustrated in FIG. 12, a connector 17 is attached to one side surface in the longitudinal direction of the housing 12, and an AC terminal 18 is connected to the connector 17. A connector 21 is provided on a surface from which the cooling water inflow pipe 13 and the cooling water outflow pipe 14 are led out.

As illustrated in FIG. 13, the electric circuit body 400 is accommodated in the housing 12. The control circuit 172 and the driver circuit 174 are disposed above the electric circuit body 400, and the capacitor module 500 is accommodated on the DC terminal side of the electric circuit body 400. By disposing the capacitor module at the same height as the electric circuit body 400, the power converter 200 can be thinned, and the degree of freedom in installation on a vehicle is improved. The AC side terminal 320B of the electric circuit body 400 penetrates the current sensor 180 and is connected to the connector 188.

According to the present embodiment, even when the second conductor plate 431 and the fourth conductor plate 433 are warped or inclined, the sheet-shaped member 440 including the resin insulating layer 441 having a low thermal conductivity follows and adheres to the warpage or inclination of the second conductor plate 431 and the fourth conductor plate 433 with a constant thickness. On the other hand, the metal-based heat conduction member 450 having a high thermal conductivity comes into close contact with the cooling member 340 due to a change in the thickness thereof, and the heat dissipation is improved.

According to the embodiment described above, the following operational effects can be obtained.

(1) The electric circuit body 400 includes a circuit body 310 having a first power semiconductor element (first active element 155) that is sandwiched between a first conductor plate 430 on one surface thereof and a second conductor plate 431 on the other surface thereof, a cooling member 340 disposed on both surfaces of the circuit body 310, a sheet-shaped member 440 adhered to at least the second conductor plate 431 and having at least a resin insulating layer 441, and a metal-based heat conduction member 450 provided between the sheet-shaped member 440 and the cooling member 340 so as to be in contact with the sheet-shaped member 440 and the cooling member 340. This makes it possible to improve heat dissipation without using a ceramic substrate.

(2) In the method for manufacturing the electric circuit body 400, the first power semiconductor element (first active element 155) is sandwiched between the first conductor plate 430 on one surface thereof and the second conductor plate 431 on the other surface thereof, the second power semiconductor element (second active element 157) is sandwiched between the third conductor plate 432 on one surface thereof and the fourth conductor plate 433 on the other surface thereof, the sheet-shaped member 440 having at least the resin insulating layer 441 is adhered to the second conductor plate 431 and the fourth conductor plate 433 so as to cover at least the second conductor plate 431 and the fourth conductor plate 433, the metal-based heat conduction member 450 having regions having different thicknesses is adhered to the sheet-shaped member 440 along the arrangement direction of the first power semiconductor element (first active element 155) and the second power semiconductor element (second active element 157), and the cooling member 340 is brought into close contact with the metal-based heat conduction member 450. This makes it possible to improve heat dissipation without using a ceramic substrate.

The present invention is not limited to the above embodiments, and other forms conceivable within the scope of the technical idea of the present invention are also included within the scope of the present invention as long as the features of the present invention are not impaired. In addition, the above-described embodiment and a plurality of modifications may be combined.

REFERENCE SIGNS LIST 10 upper case
11 lower case
13 cooling water inflow pipe
14 cooling water outflow pipe
17, 21, 181, 182, 188 connector
18 AC terminal
43, 140, 142 inverter circuit unit
155 first active element
156 first diode
157 second active element
158 second diode
172 control circuit
174 driver circuit
180 current sensor
192, 194 motor generator
200 power converter
300 power module
310 circuit body
315B positive electrode side terminal
319B negative electrode side terminal
320B AC side terminal
325 signal terminal
325K Kelvin emitter signal terminal
325L lower arm gate signal terminal
325M mirror emitter signal terminal
325U upper arm gate signal terminal
340 cooling member
360 sealing resin
400 electric circuit body
430 first conductor plate (upper arm circuit collector side)
431 second conductor plate (upper arm circuit emitter side)
432 third conductor plate (lower arm circuit collector side)
433 fourth conductor plate (lower arm circuit emitter side)
440 sheet-shaped member
441 resin insulating layer
442 metal foil
450 metal-based heat conduction member 460 adhesive member
500 capacitor module
601 transfer molding device
602 spring
603 cushion sheet
604 deformation jig

The invention claimed is:

1. An electric circuit body comprising:
a circuit body having a first power semiconductor element that is sandwiched between a first conductor plate on one surface thereof and a second conductor plate on the other surface thereof;
a cooling member disposed on both surfaces of the circuit body;
a sheet-shaped member adhered to at least the second conductor plate and having at least a resin insulating layer; and
a metal-based heat conduction member provided between the sheet-shaped member and the cooling member so as to be in contact with the sheet-shaped member and the cooling member; wherein
the circuit body comprises a second power semiconductor element; a third conductor plate; a fourth conductor plate, the second power semiconductor element being sandwiched between the third conductor plate and the fourth conductor plate on the other surface thereof;
the sheet-shaped member is adhered to the second conductor plate and the fourth conductor plate so as to cover at least the second conductor plate and the fourth conductor plate,
both of the second conductor plate and the fourth conductor plate have a step difference on a side in contact with the cooling member; and
a thickness of the metal-based heat conduction member is changed to absorb the step difference generated in the second conductor plate and the fourth conductor plate.

2. The electric circuit body according to claim 1, wherein the sheet-shaped member comprises a first sheet-shaped member adhered to the second conductor plate; and a second sheet-shaped member adhered to the fourth conductor plate, and
in the metal-based heat conduction member, a portion in contact with the first sheet-shaped member and a portion in contact with the second sheet-shaped member are provided separately from each other.

3. The electric circuit body according to claim 1, wherein the metal-based heat conduction member has a lower yield point than the cooling member.

4. The electric circuit body according to claim 1, wherein the metal-based heat conduction member has regions having different thicknesses.

5. The electric circuit body according to claim 1, wherein the metal-based heat conduction member has regions having different thicknesses along an arrangement direction of the first power semiconductor element and the second power semiconductor element.

6. The electric circuit body according to claim 1, wherein the metal-based heat conduction member has an adhesive member provided on an outer periphery thereof.

7. The electric circuit body according to claim 1, wherein the sheet-shaped member comprises the resin insulating layer and a metal foil, and the metal foil is in contact with the metal-based heat conduction member.

8. The electric circuit body according to claim 7, wherein the metal foil is metal-joined to the metal-based heat conduction member.

9. A power converter comprising:
an electric circuit body according to claim 1; and
an inverter circuit unit configured by combining the electric circuit body, and
converting DC power into AC power.

* * * * *